US012757461B2

(12) United States Patent
Cheng

(10) Patent No.: US 12,757,461 B2
(45) Date of Patent: Oct. 6, 2026

(54) COMPOSITE SUBSTRATE AND MANUFACTURING METHOD THEREFOR, AND SEMICONDUCTOR DEVICE STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 403 days.

(21) Appl. No.: 18/457,867

(22) Filed: Aug. 29, 2023

(65) Prior Publication Data

US 2024/0234514 A1 Jul. 11, 2024

(30) Foreign Application Priority Data

Jan. 6, 2023 (CN) ......................... 202310019895.2

(51) Int. Cl.
*H10D 62/53* (2025.01)
*H10D 30/47* (2025.01)
*H10D 62/80* (2025.01)
*H10H 20/812* (2025.01)

(52) U.S. Cl.
CPC ........... *H10D 62/53* (2025.01); *H10D 30/475* (2025.01); *H10D 62/80* (2025.01); *H10H 20/812* (2025.01)

(58) Field of Classification Search
CPC ...... H10D 62/53; H10D 30/475; H10D 62/80; H10H 20/812
See application file for complete search history.

(56) References Cited

U.S. PATENT DOCUMENTS

2019/0148217 A1* 5/2019 Moser ................. H10W 10/014 257/620

FOREIGN PATENT DOCUMENTS

EP 2317554 B1 * 4/2014 ......... H10D 84/0165

* cited by examiner

*Primary Examiner* — Samuel A Gebremariam
(74) *Attorney, Agent, or Firm* — Westbridge IP LLC

(57) ABSTRACT

Disclosed are a composite substrate and a manufacturing method therefor, and a semiconductor device structure. The composite substrate includes a substrate and a plurality of strengthening structures, where the plurality of strengthening structures are disposed within the substrate at intervals, and a material of the plurality of strengthening structures is a poly-crystal material or an amorphous material. The composite substrate provided by the present disclosure may withstand stress, constrain deformation, and prevent extension of a dislocation by providing the strengthening structures inside the substrate, thereby enhancing mechanical strength of the composite substrate. By filling the poly-crystal material or the amorphous material in the single-crystal substrate, the extension of the dislocation in single-crystal substrate may be prevented, so that the strength of substrate may be improved, and probability of fragmentation of the composite substrate may be reduced.

11 Claims, 7 Drawing Sheets

COMPOSITE SUBSTRATE AND MANUFACTURING METHOD THEREFOR, AND SEMICONDUCTOR DEVICE STRUCTURE

CROSS-REFERENCE TO RELATED APPLICATIONS

This application claims priority to Chinese Patent Application No. CN202310019895.2, filed on Jan. 6, 2023, which is hereby incorporated by reference in its entirety.

TECHNICAL FIELD

The present disclosure relates to the field of semiconductor technologies, and in particular, to a composite substrate and a manufacturing method therefor, and a semiconductor device structure.

BACKGROUND

At present, a Metal Organic Chemical Vapor Desposition (MOCVD) method is usually used for a commercial large-scale preparation of a gallium nitride epitaxial wafer. Materials of substrates used for epitaxial growth of GaN through the MOCVD method should be selected, as much as possible, to be the same material, which is of little lattice mismatch and has a low thermal expansion coefficient. However, due to an extremely high melting point and high nitrogen saturation vapor pressure of GaN-based materials, it is hard to prepare a large-area and high-quality GaN substrate. And due to a lack of a substrate that matches the GaN lattice, currently, it is general to use a heterogeneous substrate with lattice mismatch and thermal expansion coefficient mismatch to epitaxially grow a GaN epitaxial wafer. The most commonly used heterogeneous substrates include a sapphire substrate and a silicon substrate.

As a significant gallium nitride heterogeneous epitaxial substrate, silicon substrate has advantages such as high crystal quality, large wafer size, high thermal conductivity (about three times that of sapphire), low price, and controllable substrate conductivity through doping, which has attracted increasing attention from the industry.

SUMMARY

In view of this, embodiments of the present disclosure provide a composite substrate and a manufacturing method therefor, and a semiconductor device structure to solve a technical problem of low strength and high probability of fragmentation of silicon substrates.

According to an aspect of the present disclosure, a composite substrate is provided by an embodiment of the present disclosure, and the composite substrate includes: a substrate; and a plurality of strengthening structures disposed within the substrate at intervals, where a material of the plurality of strengthening structures is a poly-crystal material or an amorphous material.

As an optional embodiment, the substrate includes a first region and a second region stacked in a vertical direction, and the plurality of strengthening structures are disposed between the first region and the second region, or completely disposed in the first region, or completely disposed in the second region.

As an optional embodiment, the plurality of strengthening structures penetrate through the first region or penetrate through the second region.

As an optional embodiment, a material of the substrate is single-crystal silicon.

As an optional embodiment, the material of the plurality of strengthening structures is one or more combinations of silicon dioxide, silicon nitride, silicon oxynitride, amorphous silicon, and poly-silicon.

As an optional embodiment, a shape of projection of the plurality of strengthening structures on a plane where the substrate is located includes any one of a polygon, a circle, an ellipse, a strip, and a mesh.

As an optional embodiment, a quantity of the plurality of strengthening structures per unit area gradually increases from a center to an edge; or a size of the plurality of strengthening structures gradually increases from the center to the edge.

As an optional embodiment, a thickness of the plurality of strengthening structures ranges from 1 to 100 μm.

As an optional embodiment, the composite substrate further includes a third region disposed on a side, away from the first region, of the second region, where the plurality of strengthening structures includes a first strengthening structure disposed between the first region and the second region, and a second strengthening structure disposed between the third region and the second region.

As an optional embodiment, a projection area of the second strengthening structure on a plane where the substrate is located completely overlaps, or partially overlaps, or completely does not overlap with a projection area of the first strengthening structure on the plane where the substrate is located.

As an optional embodiment, shapes of projection of the first strengthening structure and the second strengthening structure on a plane where the substrate is located include any one of a polygon, a circle, an ellipse, a strip, and a mesh.

As an optional embodiment, the shapes of projection of the first strengthening structure and the second strengthening structure on the plane where the substrate is located are different.

According to another aspect of the present disclosure, a semiconductor device structure is provided by an embodiment of the present disclosure, and the semiconductor device structure includes: a composite substrate provided by an embodiment of the present disclosure, a nucleation layer, a buffer layer and an active layer, where the nucleation layer, the buffer layer and the active layer are disposed on the composite substrate in sequence, and the active layer is any one of a light-emitting diode, a high-electron-mobility transistor, a high mobility diode, a Metal-Oxide-Semiconductor Field-Effect Transistor (MOSFET), a ultraviolet light-emitting diode (UV-LED), a photo-detector, a hydrogen generator and a solar cell.

As an optional embodiment, the semiconductor device structure is a high-electron-mobility transistor, and the active layer includes a GaN channel layer and an AlGaN barrier layer stacked in sequence, and a source electrode, a drain electrode, and a gate electrode disposed on the AlGaN barrier layer.

As an optional embodiment, the semiconductor device structure is a light-emitting diode, the active layer includes an N-type semiconductor layer, a multiple quantum well stack layer, and a P-type semiconductor layer stacked in sequence, a cathode disposed on the N-type semiconductor layer, and an anode disposed on the P-type semiconductor layer.

According to another aspect of the present disclosure, a manufacturing method for a composite substrate is provided by an embodiment of the present disclosure, and the preparation method includes: forming a first region of a substrate; excavating a groove on a surface of the first region to form a first groove; filling the first groove with a strengthening structure; and laterally epitaxially growing a second region on an area, not covered by the strengthening structure, of the first region to form a composite substrate with the strengthening structure inside the substrate.

As an optional embodiment, a depth of the first groove ranges from 1 to 100 μm.

As an optional embodiment, a thickness of the strengthening structure is greater than or equal to the depth of the first groove.

As an optional embodiment, the preparation method further includes: excavating a groove on a surface of the second region to form a second groove; filling the second groove with a second strengthening structure; and laterally epitaxially growing a third region on an area, not covered by the second strengthening structure, of the second region.

DETAILED DESCRIPTION OF THE EMBODIMENTS

The technical solutions in the embodiments of the present disclosure will be clearly and completely described below with reference to the accompanying drawings in the embodiments of the present disclosure. Apparently, the described embodiments are only a part of the embodiments of the present disclosure, but not all of the embodiments. Based on the embodiments in the present disclosure, all other embodiments obtained by those skilled in the art without creative efforts shall fall within the protection scope of the present disclosure.

A strength of a silicon substrate is low, and probability of fragmentation is high. The thicker a GaN epitaxial layer is, the greater a stress on the silicon substrate during a cooling process after an epitaxial growth of GaN is, which may cause a fragmentation problem easily.

Therefore, to solve a technical problem described above, it is necessary to provide a composite substrate and a preparation method therefor, and a semiconductor device structure to improve the strength of the silicon substrate and avoid the fragmentation problem.

Figure 1:
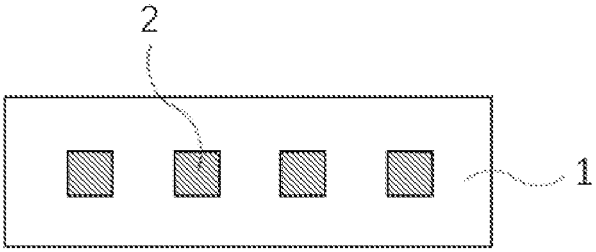
FIG. 1 is a schematic structural diagram of a composite substrate according to an embodiment of the present disclosure.

FIG. 1 is a schematic structural diagram of a composite substrate according to an embodiment of the present disclosure. Referring to FIG. 1, this embodiment provides a composite substrate, including a substrate 1, and a plurality of strengthening structures 2 disposed within the substrate 1 at intervals, where a material of the plurality of strengthening structures 2 is a poly-crystal material or an amorphous material.

In the present embodiment, a material of the substrate 1 is single-crystal silicon, and the material of the strengthening structure 2 is one or more combinations of silicon dioxide, silicon nitride, silicon oxynitride, amorphous silicon, and poly-silicon. The strengthening structure 2 maywithstand stress, constrain deformation, and prevent extension of a dislocation, thereby enhancing mechanical strength of the composite substrate. The material of the strengthening structure 2 is the poly-crystal material or the amorphous material. By filling the poly-crystal material or the amorphous material in the single-crystal substrate 1, extension of a dislocation in the single-crystal substrate 1 may be prevented, so that strength of the substrate 1 may be improved, and probability of fragmentation of the composite substrate may be reduced.

Figure 2A:
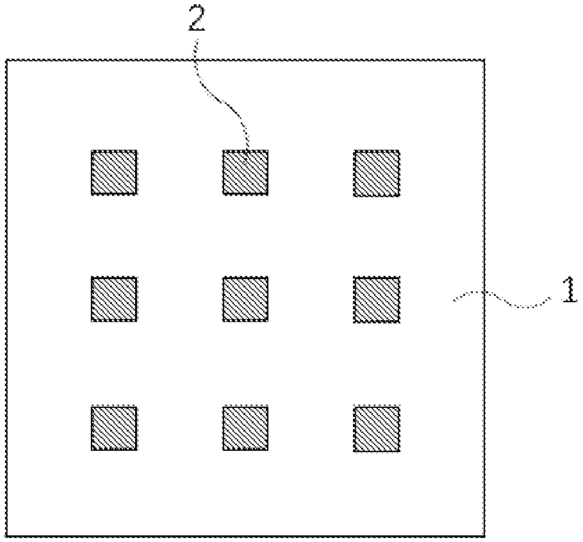
FIG. 2*a* to FIG. 2*g* are top views of a composite substrate according to an embodiment of the present disclosure.
Figure 2B:
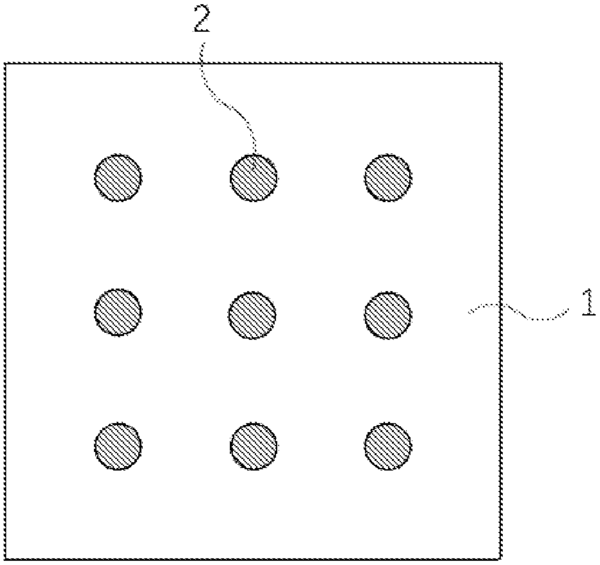
Figure 2C:
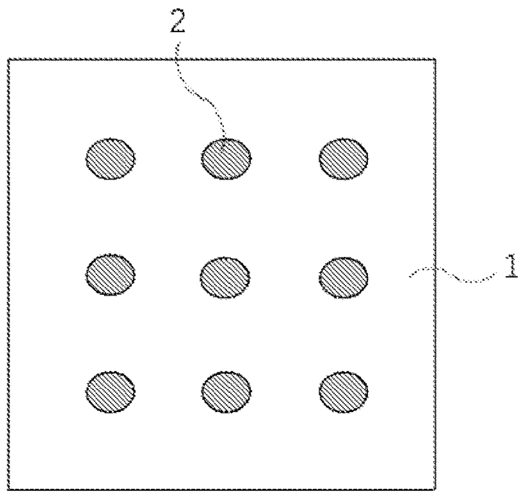
Figure 2D:
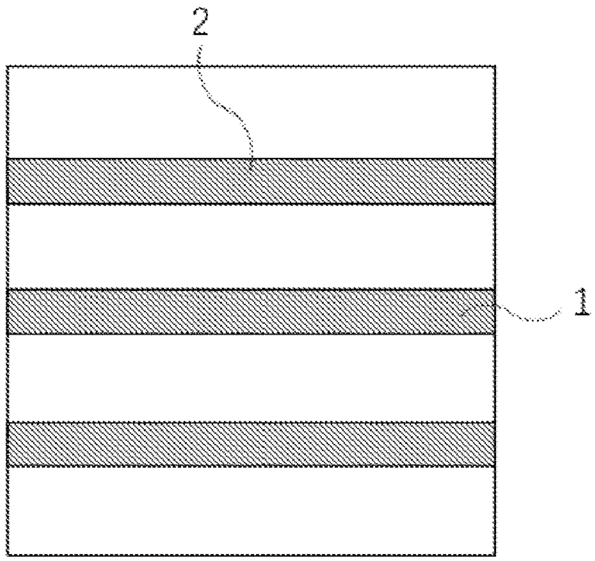
Figure 2E:
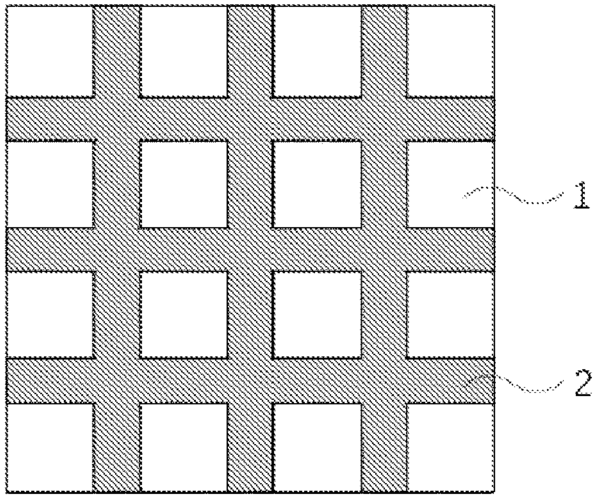

In the present embodiment, a shape of projection of the strengthening structure 2 on a plane where the substrate 1 is located includes any one of a polygon, a circle, an ellipse, a strip, and a mesh. FIG. 2*a* to FIG. 2*g* are top views of a composite substrate according to an embodiment of the present disclosure as shown in FIG. 1. The shape of the strengthening structure 2 may be a rectangle, as shown in FIG. 2*a*; may be a circle, as shown in FIG. 2*b*; may be an ellipse, as shown in FIG. 2*c*; may be a strip, as shown in FIG. 2*d*; or may be a mesh, as shown in FIG. 2*e*. Different mesh structures may improve efficiency of capturing/interrupting dislocations. The shape of projection of the strengthening structure 2 on a horizontal plane is not limited to the present disclosure.

Figure 2F:
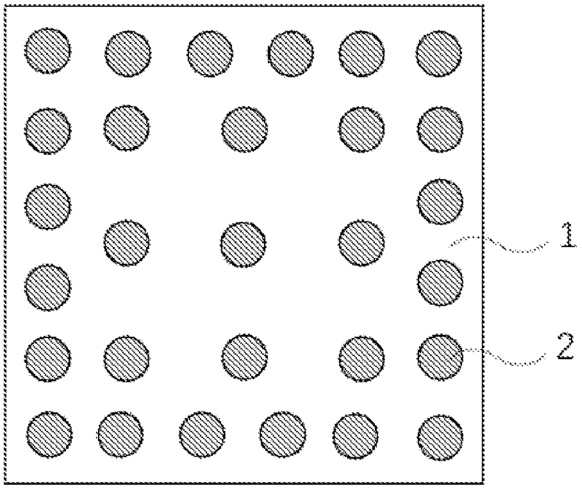
Figure 2G:
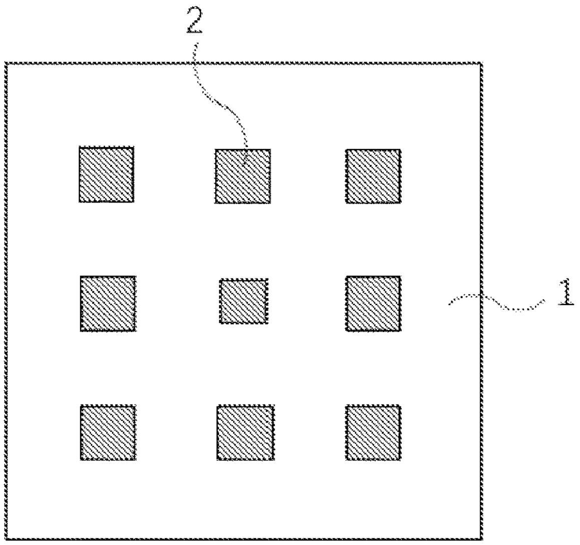

According to the embodiments shown in FIG. 2*a* to FIG. 2*e*, shapes of projection of the strengthening structures 2 on the horizontal plane are uniformly distributed on the plane where substrate 1 is located. In other embodiments, the distribution of the shapes of projection of the strengthening structures 2 on the horizontal plane may also be uneven on the plane where substrate 1 is located. A quantity of the strengthening structures 2 per unit area gradually increases from a center to an edge, as shown in FIG. 2*f*, or size of the strengthening structure 2 gradually increases from the center to the edge, as shown in FIG. 2*g*. A thickness of the strengthening structure 2 ranges from 1 to 100 μm.

It can be understood that the shape of projection, distribution regularity, spacing size, and the like of the strengthening structure 2 on the horizontal plane may be changed, as long as the strengthening structure 2 may withstand stress, constrain deformation, and prevent extension of a dislocation, and can avoid fragmentation of the composite substrate.

Figure 3A:
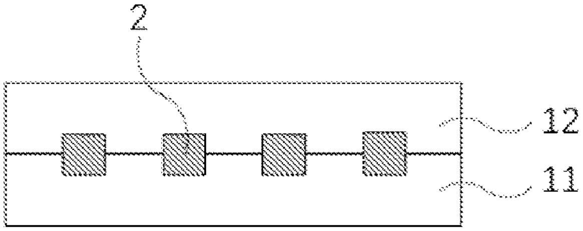
FIG. 3*a* to FIG. 3*c* are schematic structural diagrams of a composite substrate according to an embodiment of the present disclosure.
Figure 3B:
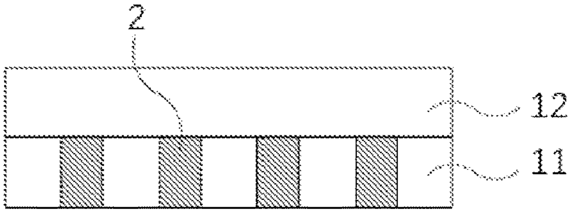
Figure 3C:
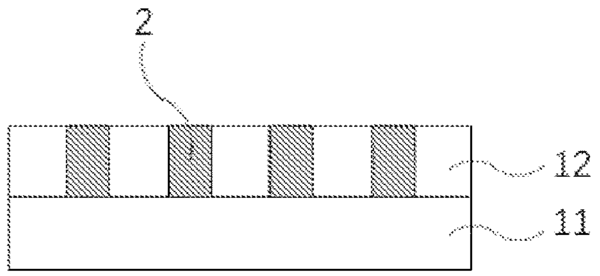

In the present embodiment, FIG. 3*a* to FIG. 3*c* are schematic structural diagrams of a composite substrate according to an embodiment of the present disclosure. A substrate 1 includes a first region 11 and a second region 12 stacked in a vertical direction, and a strengthening structure 2 is disposed between the first region 11 and the second region 12 (FIG. 3*a*), or completely disposed in the first region 11 and penetrate through the first region 11 (FIG. 3*b*), or completely disposed in the second region 12 and penetrate through the second region 12 (FIG. 3*c*). The second region 12 begins to grow on an area, not covered by the strengthening structure 2, of a surface of the first region 11, then grows laterally epitaxially to merge. And finally the composite substrate is obtained. A lateral epitaxial method may reduce defect density by defect merging, and further reduce probability of fragmentation of the composite substrate.

Figure 4A:
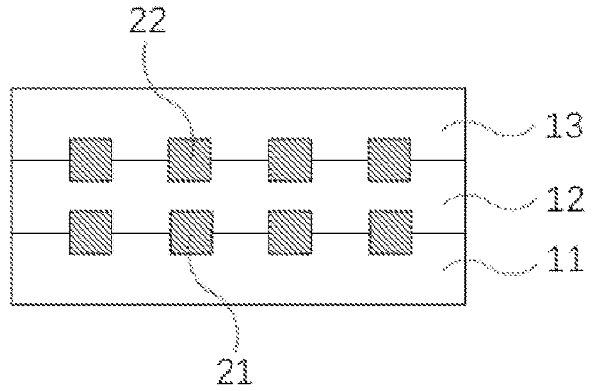
FIG. 4*a* to FIG. 4*c* are schematic structural diagrams of a composite substrate according to another embodiment of the present disclosure.
Figure 4B:
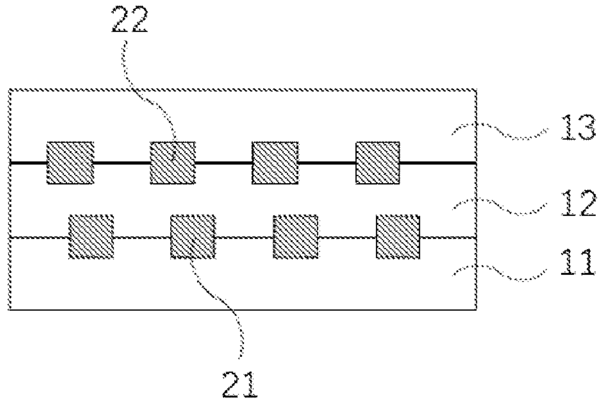
Figure 4C:
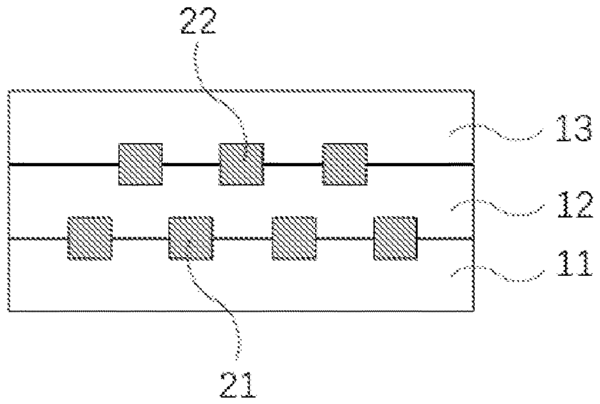

FIG. 4*a* to FIG. 4*c* are schematic structural diagrams of a composite substrate according to another embodiment of the present disclosure. A structure of the composite substrate in the present embodiment is roughly the same as the embodiment shown in FIG. 1, and a difference is that, as shown in FIG. 4*a* to FIG. 4*c*, the composite substrate further includes a third region 13 disposed on a side, away from the first region 11, of the second region 12, the strengthening structure 2 includes a first strengthening structure 21 disposed between the first region 11 and the second region 12, and a second strengthening structure 22 disposed between the third region 13 and the second region 12. Shapes of projection of the first strengthening structure 21 and the second strengthening structure 22 on a plane where the substrate 1 is located include any one of a polygon, a circle, an ellipse, a strip, and a mesh. And the shapes of projection of the first strengthening structure 21 and the second strengthening structure 22 on the plane where the substrate 1 is located are different. In the present embodiment, the arrangement of multiple layers of strengthening structures in the composite substrate may make the composite substrate uniformly withstand stress, so that probability of fragmentation of the composite substrate may be further reduced.

In the present embodiment, a projection area of the second strengthening structure 22 on the plane where the substrate 1 is located completely overlaps with a projection area of the first strengthening structure 21 on the plane where the substrate 1 is located (as shown in FIG. 4*a*), or partially overlaps with the projection area of the first strengthening structure 21 on the plane where the substrate 1 is located (as shown in FIG. 4*b*), or completely does not overlap with the projection area of the first strengthening structure 21 on the plane where the substrate 1 is located (as shown in FIG. 4*c*). By designing positional arrangement of the multiple layers of strengthening structures, stress distribution may be further regulated, so that the problem of fragmentation of the composite substrate may be avoided.

Figure 5A:
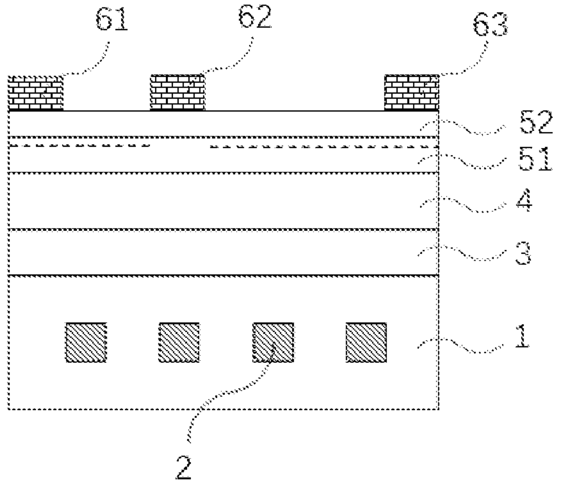
FIG. 5*a* and FIG. 5*b* are schematic structural diagrams of a semiconductor device structure according to an embodiment of the present disclosure.
Figure 5B:
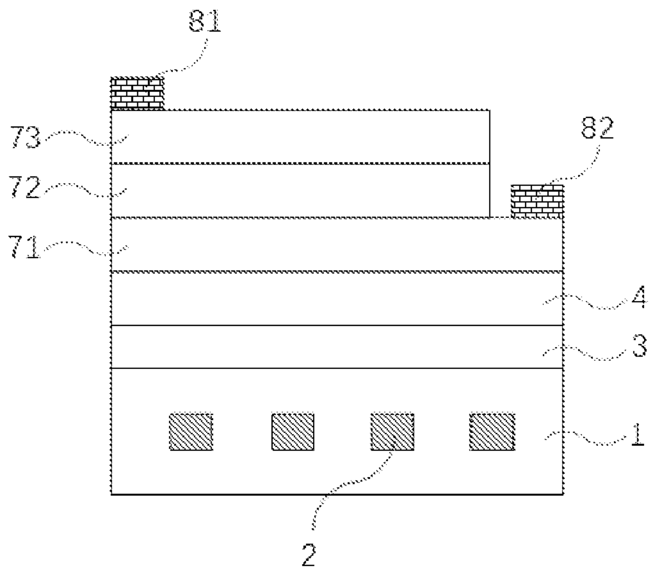

FIG. 5*a* and FIG. 5*b* are schematic structural diagrams of a semiconductor device structure according to an embodiment of the present disclosure. This embodiment provides a semiconductor device structure, and the semiconductor device structure includes a composite substrate provided by the present disclosure, a nucleation layer, a buffer layer and an active layer. The nucleation layer, the buffer layer and the active layer are disposed on the composite substrate in sequence, and the active layer is any one of a light-emitting diode, a high-electron-mobility transistor, a high mobility diode, a Metal-Oxide-Semiconductor Field-Effect Transistor (MOSFET), a ultraviolet light-emitting diode (UV-LED), a photo-detector, a hydrogen generator and a solar cell.

Specifically, when the semiconductor device structure is a high-electron-mobility transistor (as shown in FIG. 5*a*), in addition to the composite substrate provided by the present disclosure, the semiconductor device structure further includes a nucleation layer 3, a buffer layer 4, a GaN channel layer 51, an AlGaN barrier layer 52 disposed on the composite substrate, and a source electrode 61, a drain electrode 63, and a gate electrode 62 disposed on the AlGaN barrier layer 52. When the semiconductor device structure is a light-emitting diode (as shown in FIG. 5*b*), in addition to the composite substrate provided by the present disclosure, the semiconductor device structure further includes a nucleation layer 3, a buffer layer 4, an N-type semiconductor layer 71, a multiple quantum well stack layer 72, and a P-type semiconductor layer 73 disposed on the composite substrate, a cathode 82 disposed on the N-type semiconductor layer 71, and an anode 81 disposed on the P-type semiconductor layer 73.

Figure 6:
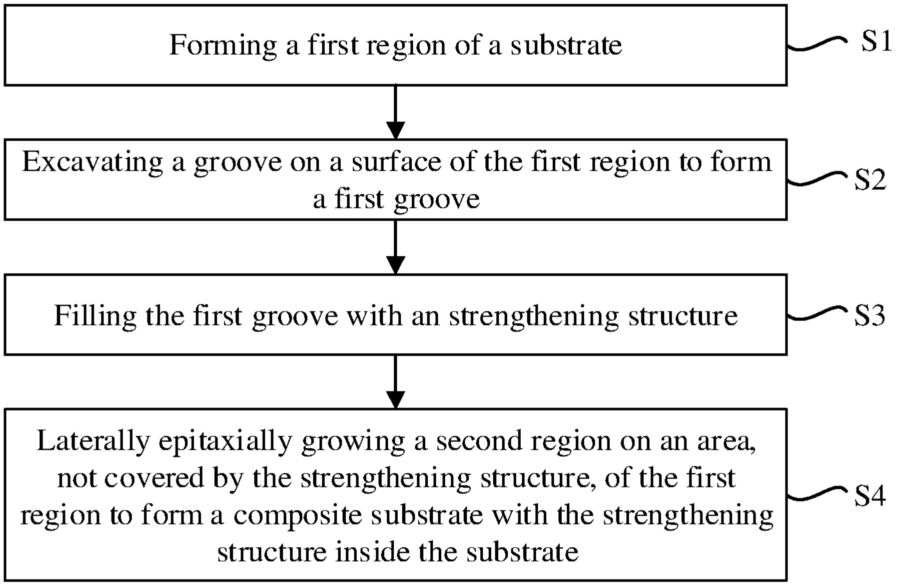
FIG. 6 is a flowchart of a manufacturing method for a composite substrate according to an embodiment of the present disclosure.

According to another aspect of the present disclosure, FIG. 6 is a flowchart of a manufacturing method for a composite substrate structure according to an embodiment of the present disclosure, FIG. 7 to FIG. 10 are decomposition diagrams of a composite substrate structure according to FIG. 6 during a manufacturing process. As shown in FIG. 6, the manufacturing method for a composite substrate includes the following steps.

Figure 7:
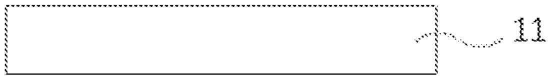
FIG. 7 to FIG. 10 are decomposition diagrams of a composite substrate structure according to FIG. 6 during a manufacturing process.

Step S1: forming a first region of a substrate. The substrate may be a single-crystal silicon substrate. As shown in FIG. 7, a method for forming the first region 11 includes one or more combinations of Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), and Metal Organic Chemical Vapor Deposition (MOCVD).

Figure 8:
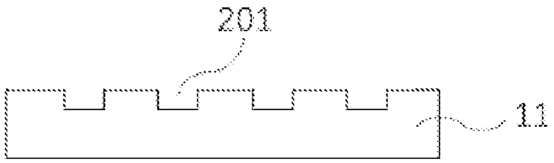

Step S2: excavating a groove on a surface of the first region to form a first groove. As shown in FIG. 8, a shape of projection of the first groove 201 on a plane where the substrate is located includes any one of a polygon, a circle, an ellipse, a strip, and a mesh, and a depth of the first groove 201 ranged from 1 to 100 μm.

Figure 9:
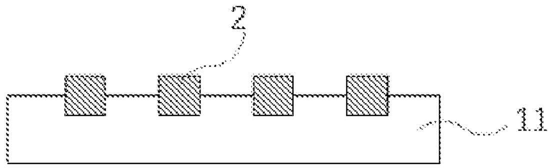

Step S3: filling the first groove with a strengthening structure. As shown in FIG. 9, a thickness of the strengthening structure 2 is greater than or equal to the depth of the first groove 201, that is, the strengthening structure 2 may be completely disposed in the first region 11 or partially disposed in the first region 11.

Figure 10:
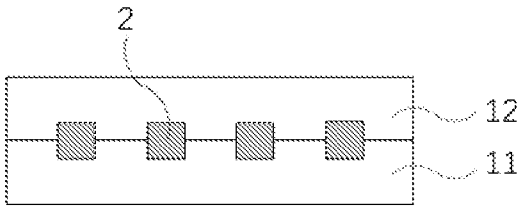

Step S4: laterally epitaxially growing a second region 12 on an area, not covered by the strengthening structure, of the first region 11 to form a composite substrate with the strengthening structure inside the substrate (as shown in FIG. 10).

Figure 11A:
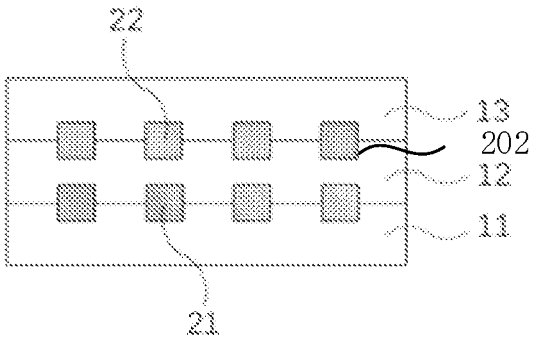
FIG. 11*a* to FIG. 11*c* are schematic structural diagrams of a composite substrate according to still another embodiment of the present disclosure.
Figure 11B:
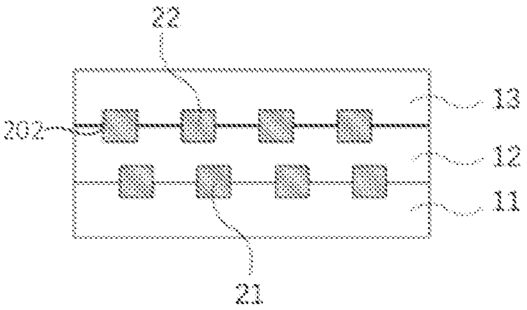
Figure 11C:
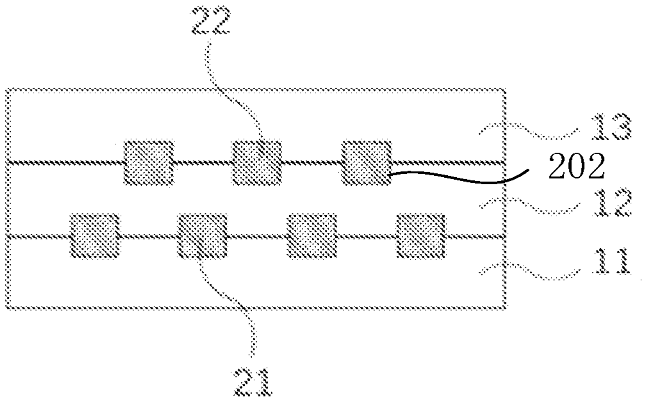

In some embodiments, the manufacturing method further includes: excavating a groove on a surface of the second region 12 to form a second groove 202; filling the second groove 202 with a second strengthening structure 22; and laterally epitaxially growing a third region 13 on an area, not covered by the second strengthening structure 22, of the second region 12 (as shown in FIG. 11*a* to FIG. 11*c*). The arrangement of multiple layers of strengthening structures in the composite substrate may make the composite substrate uniformly withstand stress, so that probability of fragmentation of the composite substrate may be further reduced.

The present disclosure provides a composite substrate and a manufacturing method therefor, and a semiconductor device structure. The composite substrate includes a substrate and a plurality of strengthening structures, where the plurality of strengthening structures are disposed within the substrate at intervals, and a material of the plurality of strengthening structures is a poly-crystal material or an amorphous material. The composite substrate provided by the present disclosure may withstand stress, constrain deformation, and prevent extension of a dislocation by providing the strengthening structures inside the substrate, thereby enhancing mechanical strength of the composite substrate. On the one hand, by filling the poly-crystal material or the amorphous material in the single-crystal substrate, the extension of the dislocation in single-crystal substrate may be prevented, so that the strength of substrate may be improved, and probability of fragmentation of the composite substrate may be reduced. On the other hand, a lateral epitaxial method may reduce defect density by defect merging, and further reduce the probability of fragmentation of the composite substrate.

It should be understood that the term "including" and its variations used in the present disclosure are open-ended, that is, "including but not limited to". The term "one embodiment" means "at least one embodiment", the term "another embodiment" means "at least one other embodiment". In this specification, the schematic expressions of the above terms do not necessarily refer to the same embodiments or examples. Moreover, the specific features, structures, materials, or characteristics described may be combined in an appropriate manner in any one or more embodiments or examples. In addition, those skilled in the art may combine and assembly different embodiments or examples described in this specification, as well as features of the different embodiments or examples, without contradiction.

The embodiments described above are only preferred embodiments of the present disclosure, and not intended to limit the protection scope of the present disclosure. Any modification, equivalent replacement, and so on that are made in the spirit and principle of the present disclosure shall fall into the protection scope of the present disclosure.

What is claimed is:

1. A composite substrate, comprising:

a substrate; and a plurality of strengthening structures disposed within the substrate at intervals, wherein a material of the plurality of strengthening structures is a poly-crystal material or an amorphous material; and the substrate comprises a first region, a second region and a third region stacked in a vertical direction, the plurality of strengthening structures comprise a first strengthening structure disposed between the first region and the second region, and a second strengthening structure disposed between the third region and the second region, and a projection area of the second strengthening structure on a plane where the substrate is located partially overlaps, or completely does not overlap with a projection area of the first strengthening structure on the plane where the substrate is located.

2. The composite substrate according to claim 1, wherein a material of the substrate is single-crystal silicon.

3. The composite substrate according to claim 1, wherein the material of the plurality of strengthening structures is one or more combinations of silicon dioxide, silicon nitride, silicon oxynitride, amorphous silicon, and poly-silicon.

4. The composite substrate according to claim 1, wherein a shape of projection of the plurality of strengthening structures on a plane where the substrate is located comprises any one of a polygon, a circle, an ellipse, a strip, and a mesh.

5. The composite substrate according to claim 4, wherein a quantity of the plurality of strengthening structures per unit area gradually increases from a center to an edge; or a size of the plurality of strengthening structures gradually increases from the center to the edge.

6. The composite substrate according to claim 1, wherein a thickness of one of the plurality of strengthening structures ranges from 1 to 100 μm.

7. The composite substrate according to claim 1, wherein shapes of projection of the first strengthening structure and the second strengthening structure on a plane where the substrate is located comprise any one of a polygon, a circle, an ellipse, a strip, and a mesh.

8. The composite substrate according to claim 7, wherein the shapes of projection of the first strengthening structure and the second strengthening structure on the plane where the substrate is located are different.

9. A semiconductor device structure, comprising:

the composite substrate according to claim 1, a nucleation layer, a buffer layer and an active layer, wherein the nucleation layer, the buffer layer and the active layer are disposed on the composite substrate in sequence, and the active layer is any one of a light-emitting diode, a high-electron-mobility transistor, a high mobility diode, a Metal-Oxide-Semiconductor Field-Effect Transistor (MOSFET), a ultraviolet light-emitting diode (UV-LED), a photo-detector, a hydrogen generator and a solar cell.

10. The semiconductor device structure according to claim 9, wherein the semiconductor device structure is a high-electron-mobility transistor, and the active layer comprises a GaN channel layer and an AlGaN barrier layer stacked in sequence, and a source electrode, a drain electrode, and a gate electrode disposed on the AlGaN barrier layer.

11. The semiconductor device structure according to claim 9, wherein the semiconductor device structure is a light-emitting diode, the active layer comprises an N-type semiconductor layer, a multiple quantum well stack layer, and a P-type semiconductor layer stacked in sequence, a cathode disposed on the N-type semiconductor layer, and an anode disposed on the P-type semiconductor layer.

* * * * *